United States Patent [19]
Wieschhoff et al.

[11] Patent Number: 4,829,592
[45] Date of Patent: May 9, 1989

[54] CIRCUIT AND METHOD OF SUPPRESSING INTER-STATION RADIO TUNING NOISE

[75] Inventors: Reinhard Wieschhoff, Hildesheim; Peter Seibold, Diekholzen, both of Fed. Rep. of Germany

[73] Assignee: Blaupunkt Werke GmbH, Hildesheim, Fed. Rep. of Germany

[21] Appl. No.: 812,954

[22] Filed: Dec. 24, 1985

[30] Foreign Application Priority Data

Jan. 5, 1985 [DE] Fed. Rep. of Germany ....... 3500217

[51] Int. Cl.⁴ .............................................. H04B 1/16
[52] U.S. Cl. .................................. 455/194; 455/212; 455/222
[58] Field of Search ............... 455/194, 296, 310–312, 455/222, 205, 212, 213, 218, 225, 258, 263, 208, 174

[56] References Cited

U.S. PATENT DOCUMENTS

| 4,085,370 | 4/1978 | van der Poel et al. | 455/222 |
| 4,204,169 | 5/1980 | Sato et al. | 455/194 |
| 4,280,139 | 7/1981 | Mogi et al. | 455/174 |
| 4,301,541 | 11/1981 | Tanaka et al. | 455/222 |
| 4,334,317 | 6/1982 | Beesley | 455/194 |
| 4,342,120 | 7/1982 | Settlemire et al. | 455/222 |
| 4,365,349 | 12/1982 | Ogita et al. | 455/194 |
| 4,388,731 | 6/1983 | King | 455/222 |
| 4,426,735 | 1/1984 | Kasperkovitz | 455/222 |
| 4,525,867 | 6/1985 | Shiratani | 455/194 |
| 4,580,286 | 4/1986 | Richards, Jr. | 455/222 |
| 4,630,290 | 12/1986 | Kage | 455/222 |
| 4,648,128 | 3/1987 | Toffolo | 455/222 |

FOREIGN PATENT DOCUMENTS 0005206 1/1977 Japan .................. 455/222

Primary Examiner—Robert L. Griffin
Assistant Examiner—Curtis Kuntz
Attorney, Agent, or Firm—Frishauf, Holtz, Goodman & Woodward

[57] ABSTRACT

To suppress tuning noise interferences, and particularly transients, such as whistles and the like, especially in FM receivers during retuning of the receiver, an inter-station retuning muting circuit is, in accordance with the invention, modified by including therein a switchable filter (2) having a low-frequency cut-off ($f_{g2}$) which is higher than the frequency of noise interference due to retuning of the receiver, the filter being switched to the higher frequency cut-off level for a period of time ($T_E$) which exceeds the normal muting time ($T_E$) of FM receivers.

11 Claims, 2 Drawing Sheets

CIRCUIT AND METHOD OF SUPPRESSING INTER-STATION RADIO TUNING NOISE

The present invention relates to radio receivers, and more particularly to frequency modulation (FM) receivers and to circuits and methods for use therein to suppress interference and noise which arises when the receiver is tuned from a station to another station, hereinafter referred to, for simplicity, as interstation tuning noise.

BACKGROUND

When tuning receivers, and particularly FM receivers, the overall high amplification causes noise to occur between tuning positions in which a particular station is precisely tuned. This inter-station tuning noise is disagreeable. When a transmitter has been tuned by a receiver, the S-shaped discriminator curve of the FM demodulator results in a low-frequency compensation, the basic frequency of which is dependent on the speed of tuning, that is, on the speed of changing the tuned circuit from detuned to tuned—and, if continued, to again detuned position.

Additional low-frequency noise disturbances occur due to locking of phase-locked loops (PLLs) mixing oscillator systems. The tuning voltges which are applied in such systems to frequency determining tuning diodes of the oscillators are modulated with the voltage which occurs during the tuning. This voltage will be presented to the FM demodulator of the receiver and will be reproduced as frequency modulation to the demodulation.

The inter-station tuning noise as well as the various compensation and leveling processes which occur result in undesirable interference noise, which can be heard by the user. Inter-station tuning noise can be suppressed in accordance with known circuit arrangements, usually referred to as muting arrangements and circuits. In known muting circuits, the audio frequency path has a gate circuit or switching circuit coupled therein which, during the tuning itself, blocks reproduction of audio output from the receiver for some predetermined period of time. The closing of this gate, which means interrupting the audio path to a reproducer, may be controlled by timing circuits with different time constants for first closing the gates and then opening the gates to permit transmission of audio output. The time constants upon opening the gates are usually substantially longer than those for closing the gates in order to mute even the lowest frequency tuning noises.

If a receiver is tuned very rapidly, for example upon a rapid transition from one transmitter to another, the scanning times or clocking times for the gate become so short that the lowest frequency noise or compensation noises will occur for a period of time longer than the scanning time. Known mating circuits, thus, can no longer carry out mating of inter-station tuning noises efficiently and effectively under such rapid tuning conditions. Rapid tuning may, for example, occur manually or in an automatic search mode of operation of a receiver.

THE INVENTION

It is an object to provide a circuit and a method to suppress inter-station noises upon tuning a receiver, typically an FM receiver, in which tuning whistles and tuning noises are muted even though the operation time of retuning is very short, and even though the frequency of the tuning noises may extend beyond the time for returning of the receiver.

Briefly, a switchable high-pass filter is connected to the radio receiver; a gate circuit is provided in the audio path, which is controlled to inhibit transmission of audio signals to an audio signal terminal. The switchable high-pass filter, connected to the audio stage, has a first low-frequency cut-off frequency level $f_{g1}$ and a second low-frequency cut-off frequency level $f_{g2}$ which is higher than the first frequency cut-off level, and which is above the frequency of the noise interference due to retuning of the receiver. The filter is controlled to the second and higher frequency cut-off level $f_{g2}$ during retuning.

In accordance with a feature of the invention, the portion of the audio frequency signal which forms part of the frequency spectrum within the lower end or of the lowest frequency is suppressed.

The system has the advantage with respect to known muting systems that even rapid transition of tuning the receiver from one transmitter to another will not only suppress the inter-station background noise but also lowest frequency transients which may result in disturbing operating noise.

DRAWINGS

FIG. 1 is a basic circuit diagram of the system in accordance with the invention;

FIG. 2, in a plurality of graphs, illustrates voltage-time diagrams of signals occurring in the system of FIG. 1;

and FIG. 3 is a detail circuit diagram of the system of FIG. 1.

DETAILED DESCRIPTION

Figure 1:
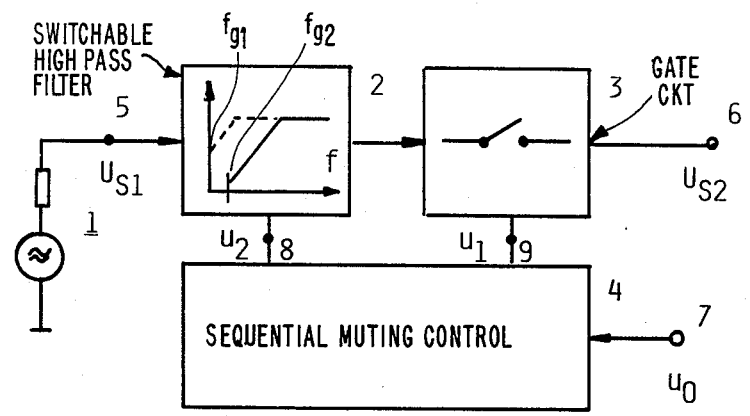

The audio stage of an FM radio is partially schematically shown in FIG. 1 as a low-frequency source, shown merely as a generator coupling resistor 1. A signal transmission path extends for example from the output of an FM discriminator circuit from the FM receiver, coupled to an audio output terminal 5 thereof, providing a signal voltage $U_{S1}$. The signal voltage $U_{S1}$ at the output 5 of the source 1 is connected, in accordance with a feature of the invention, to a switchable high-pass filter 2. The output of the switchable high-pass filter 2 is connected to a gate circuit 3 which, in turn, is connected to the output 6 of the circuit, at which an output voltage $U_{S2}$ will be available. The terminal 6 may be connected, as known, for example to a power amplifier and then to a loudspeaker. The output voltage $U_{S2}$, thus can be further amplified and then reproduced.

The filtering characteristics of the switchable filter 2 can be controlled from a control input 8. The gate circuit 3 is controlled from a control input 9. A control circuit 4 provides control signals $u_2$ at terminal 8, and signals $u_1$ at terminal 3. The control signals are generated by the control circuit 4 functioning as a sequential muting control based on signal $u_0$ on signals applied thereto at an input terminal 7. The signals applied to the input terminal 7 initiate the muting of the receiver. The sequential muting control circuit 4, essentially, includes square-wave output wave-shaping circuits which convert the signals received at terminal 7 into suitable control signals at the respective outputs 8 and 9 to effect switching of the respective elements 2 and 3.

OPERATION, WITH REFERENCE TO FIG. 2

Figure 2:
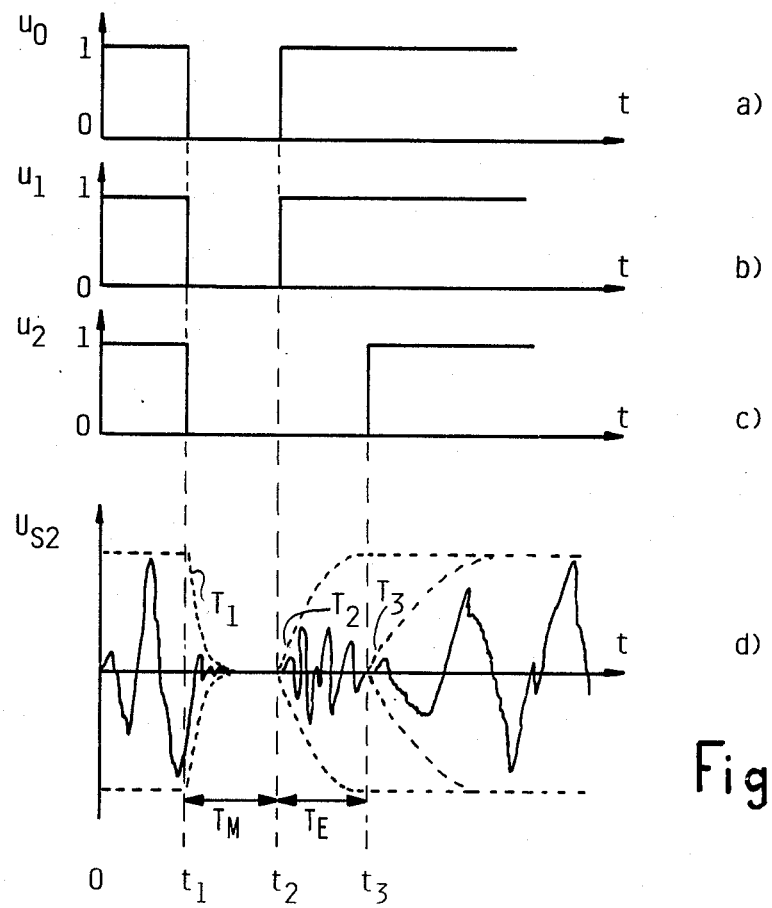

Graph a of FIG. 2 shows the signal $u_0$ applied to terminal 7 of the control circuit 4. This signal, during the time when the receiver is being tuned to a transmitter, has the digital value 1; during retuning, the signal $u_0$ changes to the value 0. The beginning of the retuning is shown at time $t_1$, the end of retuning the receiver at the time $t_2$.

The control signal $u_1$, available at terminal 9, is shown in graph b of FIG. 2. In the example illustrated, the control signal which controls the gate 3 has the same shape as the control signal $u_0$. It is applied via terminal 9 to the gate circuit 3 which, thus, between the time periods $t_1$ and $t_2$ gate 3 is switched into the non-conductive or OFF state. As seen in graph (b) of FIG. 2, gate 3 will become conductive after time $t_2$ and pass those audio signals applied thereto to output terminal 6 which can pass through the filter 2.

In accordance with a feature of the invention, the switchable high-pass filter 2 will receive a signal as shown in graph c of FIG. 2. The voltage $u_2$ is applied via terminal 8. The signal $u_2$ starts at the same time, that is, at time $t_1$, as the control signals $u_0$ and $u_1$. In accordance with a feature of the invention, however, the time the signals from circuit 4 terminate is extended to a time period $t_3$.

Figure 3:
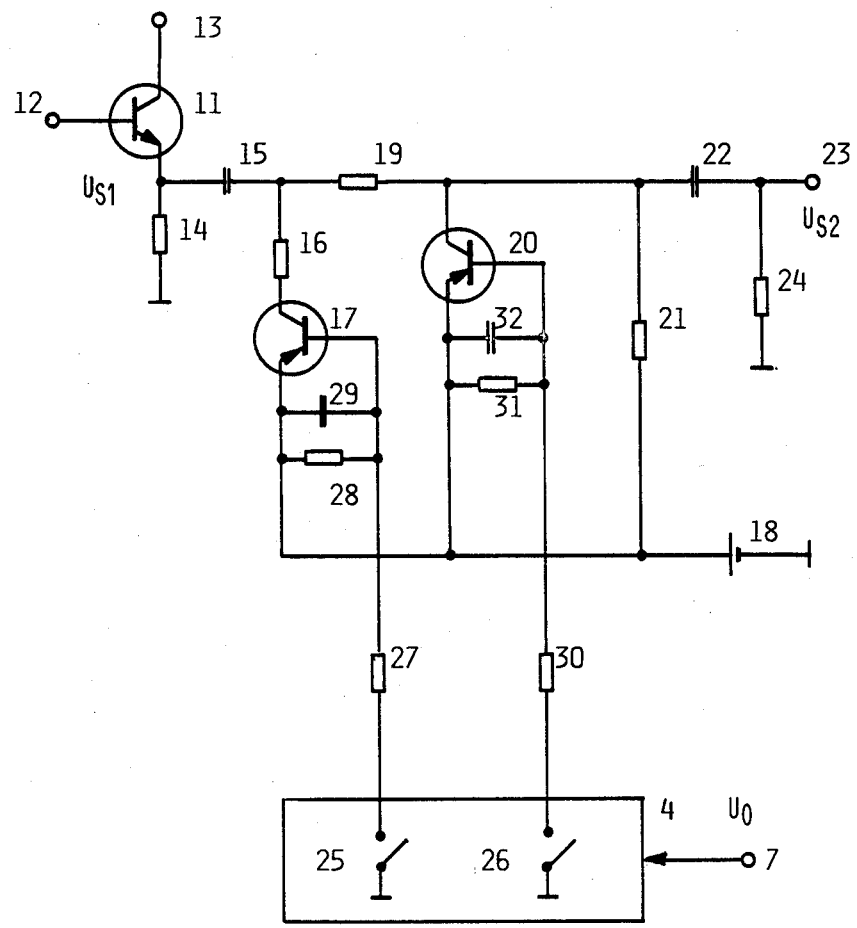

Before the signals to switch the high-pass filter 2 and the gate control 3 are applied, they pass through a low-pass filter, not shown in FIG. 1, and which will be described in detail in connection with FIG. 3. The reason for the low-pass filter is this: Upon switching audio signals, abrupt switching conditions are undesirable since they lead to abrupt switching noises or switching clicks. The effect of switching and of the low-pass filter is illustrated in graph d of FIG. 2. The audio signal $U_{S2}$ at the output 6 is suppressed at the instant $t_1$. This suppression, however, is not instantaneous as the square waves of graphs a, b and c may indicate, but occurs, rather, over a period of time $T_1$, forming a first time constant. This time constant $T_1$ is substantially shorter than the overall duration of the muting, which is formed by the difference in timing between $t_2$ and $t_1$ shown at $T_M$, with respect to a null or zero reference shown in the graphs of FIG. 2 or mathematically: $T_M = t_2 - t_1$. Simultaneously with switching OFF the muting stage, that is, opening or conduction of the gate 3, the high-pass filter 2 is switched to a higher frequency level of its base or cut-off frequency, and shown in the block of the high-pass filter 2 by the solid-line frequency graph $f_{g2}$. This higher level of the lowest limiting frequency is above the frequency of the lowest frequency disturbances upon retuning. The broken-line curve $f_{g1}$ shows the unswitched filter characteristic.

After the time $T_M$ for muting has expired, that is, at the time $t_2$, the gate 3 is switched over to ON or conductive condition. Again, this switching is not in accordance with the square-wave signal shown in graphs a and b but, rather, gradually with a time constant $T_2$.

In accordance with a feature of the invention, and until the period of time $t_3$, the lower limiting or cut-off frequency of the high-pass filter 2 remains switched to the higher value. During this extended time $T_E$, that is, ($t_3 - t_2$), the muting gate circuit 3 is conductive, and the desired program of the new station can be heard already. The lowest frequencies, however, are still cut off by the high-pass filter 2, still switched to operate according to graph $f_{g2}$ and will become audible only after the time $t_3$, upon re-switching of the high-pass filter 2. Again, this re-switching is not abrupt but will be carried out gradually, with a timing constant $T_3$.

DETAILED CIRCUIT, WITH REFERENCE TO FIG. 3

The signals corresponding to the signals $U_{S1}$ at terminal 5 are applied to a terminal 12 (FIG. 3) and to the base of a transistor 11 which is supplied by a source of current from terminal 13, and connected in form of an emitter-follower circuit. The transistor 11 is provided only to form a low resistance signal source, and any other equivalent circuit may be used. In effect, the transistor 11 operates as a directly connected collector circuit.

Capacitor 15, together with the circuit network coupled thereto, forms a high-pass filter. The terminal of capacitor 15 remote from the signal source formed by transistor 11 is connected to a resistor 16 which can be coupled to a transistor 17 to a source of constant or fixed voltage, schematically indicated by battery 18. When the transistor 17 is conductive, the lower limiting frequency $f_{g2}$ will be higher than the lowest lower limiting frequency $f_{g1}$, that is, at a time when the transistor 17 is cut off and, hence, the resistor 16 is effectively removed from the circuit.

The value of the resistors 19, 21 is so selected that the lowest limiting frequency $f_{g1}$ is below the frequency range which is to be transmitted to the audio output terminal 6 (FIG. 1) or, in FIG. 3, terminal 23. Resistor 16 is small with respect to the effective resistance of the further resistors so that the higher limiting frequency $f_{g2}$ will fall clearly above frequency $f_{g1}$, and thus cut off the lower portion of the otherwise transmitted audio frequency band.

The capacitor 15, resistor 16 and transistor 17 form, essentially, the switchable filter 2. The gate circuit 3 is formed by the resistor 19 and transistor 20. When transistor 20 is conductive, the output terminal of resistor 19 is coupled to the constant voltage, shown schematically by the battery 18, so that, in effect, the output signal is short-circuited. The resistor 21, together with the resistor 19, divides the low-frequency or audio signal to form a value which, upon controlling transistor 20 to blocked or non-conductive state, does not cause distortion due to the presence of the connector-emitter diodes of the transistor 20. Further, the resistor 21 and resistor 19 forming, together, a voltage divider, additionally form a voltage reference for the collectors of the transistors 17 and 20. Capacitor 22 is a coupling capacitor which applies the output audio signal to a terminal 23, corresponding to terminal 6, FIG. 1, for further amplification and processing of the signal and, eventually, to a loudspeaker or other reproducer. The input resistance for further circuits is schematically represented by resistor 24.

Transistors 17 and 20 are controlled by the tuning control circuit 4, as described in connection with FIG. 1. The control voltage $u_0$ applied to terminal 7 is converted by switches 25, 26, which may be semiconductor switching circuits, into essentially square-wave control voltages $u_1$, $u_2$. As explained, low-pass filters apply the voltages to the bases of the transistors 17, 20, respectively, so that the transistors will not switch abruptly in accordance with, essentially, square-wave switching but, rather, with gradual transition. The low-pass filter for transistor 17 is formed by the resistors 27, 28 and capacitor 29. The low-pass filter for the transistor 20 is formed by resistors 30, 31 and capacitor 32.

FIG. 2, graph d, clearly illustrates that the time constant $T_1$, which switches the gate 3 into non-conductive or OFF condition, is short with respect to the muting time gap $T_M$ between time instants $t_1$ and $t_2$. That is due to the desirable feature that the muting should occur as promptly after a retuning operation has been initiated as possible. The time constants $T_1$ is determined by the resistors 30, 31 and the capacity of the capacitor 32.

To suppress the lowest frequency oscillations during retuning, it is necessary that the timing period $(t_3 - t_1)$ is longer than $n:f_s$, wherein $f_s$ is the dominant or base frequency of the oscillation; typically a transient oscillation is to be suppressed, and n is the number of the oscillations to be suppressed upon retuning.

Based on the foregoing condition, two situations can be distinguished:

(1) $T_M(t_2-t_1)$ is substantially longer than $n:f_s$. Under these conditions, $T_E=t_3-t_2$ can be 0; and If $T_3$ is substantially shorter than $T_M$ the overall switching course remains essentially unchanged upon repeated retuning of the receiver.

(2) $T_M(t_2-t_1)$ is similar to smaller than $n:f_s$. The respective control voltages $u_1$ and $u_2$, and interval $T_E$, with the filter 2 switched to graph $f_{g2}$ illustrated in FIG. 2, graphs b and c then are necessary. The timing constant, time period $T_2$, can be approximately the same as that of $T_3$, or identical thereto—see FIG. 2, graph d.

Other types of filters than high-pass filters or specifically the filters shown herein may be used. The interfering frequencies and particularly the frequencies which have to be suppressed during retuning, and transients, have to be considered. For example, a notch filter for a PLL circuit can be used with, for example, a limiting frequency of 1.25 kHz. It may also be desirable to switch over the limiting frequency of the high-pass filter at the beginning of retuning of the receiver, that is, before switching of the gate 3, so that the high-pass filter will be switched to the higher cut-off value. The time sequence of the control voltages $u_1$ and $u_2$ then has to be changed to match the changed operating mode.

Various changes and modifications may be made within the scope of the inventive concept.

In an operative embodiment for an FM receiver, the following values were found suitable:
Capacitor 15, 0.47 Micro F;
resistor 16, 390 Ohms;
resistors 27, 28, 18 k Ohms; 23 k Ohms; capacitor 29 0.47 Micro F.;
resistors 30, 31, 18 k Ohms; 23 k Ohms; capacitor 32, 0.47 micro F.;
resistor 19, 33 k Ohms; resistor 21; 330 k Ohms.

We claim:

1. A radio receiver, particularly FM receiver having an audio stage providing an audio signal and an audio transmission path, said audio stage having a muting stage which includes a gate circuit (3) which mutes output signals in the transmission path during tuning of the receiver; and inhibiting means (7, 4, 9, $u_1$) coupled to and controlling the gate circuit for inhibiting transmission of audio signals to an audio signal terminal (6) for a muting interval ($T_M$), and permitting passage of audio signals after the muting interval, said radio receiver further comprising a switchable high-pass filter (2) connected in the transmission path to the muting stage and having a first low-frequency cut-off frequency level ($f_{g1}$) and a second low-frequency cut-off frequency level ($f_{g2}$) which is at a higher frequency than said first frequency level; and muting control circuit means (7, 4, 8, $u_2$) connected to and controlling the high-pass filter (2) to the second and higher low-frequency cut-off level ($f_{g2}$) for a predetermined limited time period ($T_E$) after said muting interval, and while the gate circuit (3) transmits the audio signals in said transmission path, wherein the second higher frequency cut-off level ($f_{g2}$) is just above the frequency of noise interference due to the tuning of the receiver.

2. A receiver according to claim 1, wherein said mute circuit includes a sequential muting control circuit (4) and means (7) for applying a main control signal ($u_0$) to the sequential muting control circuit, the sequential muting control circuit (4) being connected to said switchable high-pass filter (2) and to said gate circuit (3) and providing a first control signal ($u_1$) to the gate circuit and a second control signal ($u_2$) to the switchable high-pass filter, to switch the switchable high-pass filter between the respective ranges.

3. A receiver according to claim 1, wherein said mute circuit includes a sequential muting control circuit (4); and circuit means (7) for applying a main control signal ($u_0$) to the sequential muting control circuit, the sequential muting control circuit (4) being connected to said switchable high-pass filter (2) and to said gate circuit (3) and providing a first control signal ($u_1$) to the gate circuit and a second control signal ($u_2$) to the switchable high-pass filter, to switch the switchable high-pass filter to the second low-frequency cut-off level ($f_{g2}$) for said predetermined limited time period ($T_E$).

4. A receiver according to claim 2, wherein the first and second control signals have time durations of about equal length.

5. A receiver according to claim 2, wherein the second control signal ($u_2$) has a time duration which is longer than a time duration of the first control signal ($u_1$).

6. A receiver according to claim 2, further including a low-pass filter (27, 28, 29; 30, 31, 32) connected in the path of the first and second control signals to apply said control signals gradually and prevent switching clicks.

7. A method of suppressing inter-station radio tuning noise in a radio receiver, particularly a frequency modulation (FM) receiver providing an audio signal, said noise occurring upon tuning the radio receiver from a first station to a second station said method comprising the steps of (a) muting a reproduction of the entire audio signal for the duration of a muting interval ($T_M$) when the audio signal has a characteristic representative of interstation noise; and (b) additionally suppressing a portion only of the audio signal during a limited time period ($T_E$), subsequent to the muting interval ($T_M$), which portion consists of a first portion comprising the low audio spectrum and, or lowest frequency range of the frequency spectrum of the audio signal, so that a remaining portion of the audio signal comprising the higher frequency spectrum and above said low audio spectrum end, or lowest frequency range of the frequency spectrum of the audio signal, is reproduced by the radio receiver during said limited time period ($T_E$) and subsequent to the muting interval ($T_M$).

8. A method according to claim 7, wherein, during step (b) said limited time period ($T_E$) of said additional suppression step is carried out for a period of time longer than the muting interval ($T_M$).

9. A method according to claim 7, wherein the first portion of the signal suppressed in step (b) includes the audio signal which is just above the frequency level which causes disturbances during tuning of the receiver.

10. A method according to claim 7, including the step of (c) initiating muting of a reproduction of the audio signal gradually during a first predetermined time period ($T_1$); and wherein step (b) of additionally suppressing a portion only of the audio signal is terminated gradually during a second predetermined time period ($T_2$).

11. A method according to claim 10, wherein said first and second predetermined time periods of steps (a) and (b) are sufficiently long to prevent switching clicks and are essentially equal in length.

* * * * *